United States Patent [19]

Aldridge et al.

[11] 4,217,024
[45] Aug. 12, 1980

[54] DIP SOCKET HAVING PRELOADING AND ANTIWICKING FEATURES

[75] Inventors: Lionel D. Aldridge, Seminole; John K. Cotton, Sunrise, both of Fla.

[73] Assignee: Burroughs Corporation, Detroit, Mich.

[21] Appl. No.: 3,057

[22] Filed: Jan. 12, 1979

Related U.S. Application Data

[63] Continuation-in-part of Ser. No. 849,366, Nov. 7, 1977, abandoned.

[51] Int. Cl.² .............................................. H01R 11/06
[52] U.S. Cl. ............................ 339/275 T; 339/17 CF
[58] Field of Search ...... 339/17 CF, 176 M, 176 MP, 339/220 R, 221 R, 221 M, 258 R, 258 P, 275 R, 275 B, 275 T

[56] References Cited

U.S. PATENT DOCUMENTS

| | | | |
|---|---|---|---|
| 3,188,599 | 6/1965 | Roberts | 339/17 CF |
| 3,525,972 | 8/1970 | Asick et al. | 339/65 |
| 3,594,708 | 7/1971 | Lalonde | 339/176 MP |
| 3,693,131 | 9/1972 | Klehm, Jr. | 339/176 M |
| 3,717,841 | 2/1973 | Mancini | 339/17 CF |
| 3,757,284 | 9/1973 | Klehm, Jr. | 339/17 CF |
| 3,989,331 | 11/1976 | Hanlon | 339/17 CF |
| 3,992,076 | 11/1976 | Gluntz | 339/275 B |

FOREIGN PATENT DOCUMENTS 1443288  7/1976  United Kingdom ................. 339/258 P Primary Examiner—Joseph H. McGlynn
Attorney, Agent, or Firm—James E. Ledbetter; Kevin R. Peterson

[57] ABSTRACT

A DIP socket having preloading and antiwicking features. Each socket contains a plurality of unitary metallic contacts wherein each contact has; a pair of outwardly bowed tails; an antiwicking stem; a U-shaped body with a pair of retention latches on the outward portions of the arms of the U-shaped main body, said main portion of the U-shaped body having a flexural surface; and a pair of arcuately-curved, facing, inwardly-bowed spring biasing members above the U-shaped body. The contacts are inserted into a rectangular, unitary housing having a plurality of contact cavities. Each cavity has a guiding taper and pin aperture, camming faces, a guiding chamfer and a retention ledge. One or more of the interior walls of the cavity tapers inwardly from the lower portion to the upper portion of the cavity. The housing may also include raised standoffs on its lower side.

17 Claims, 12 Drawing Figures

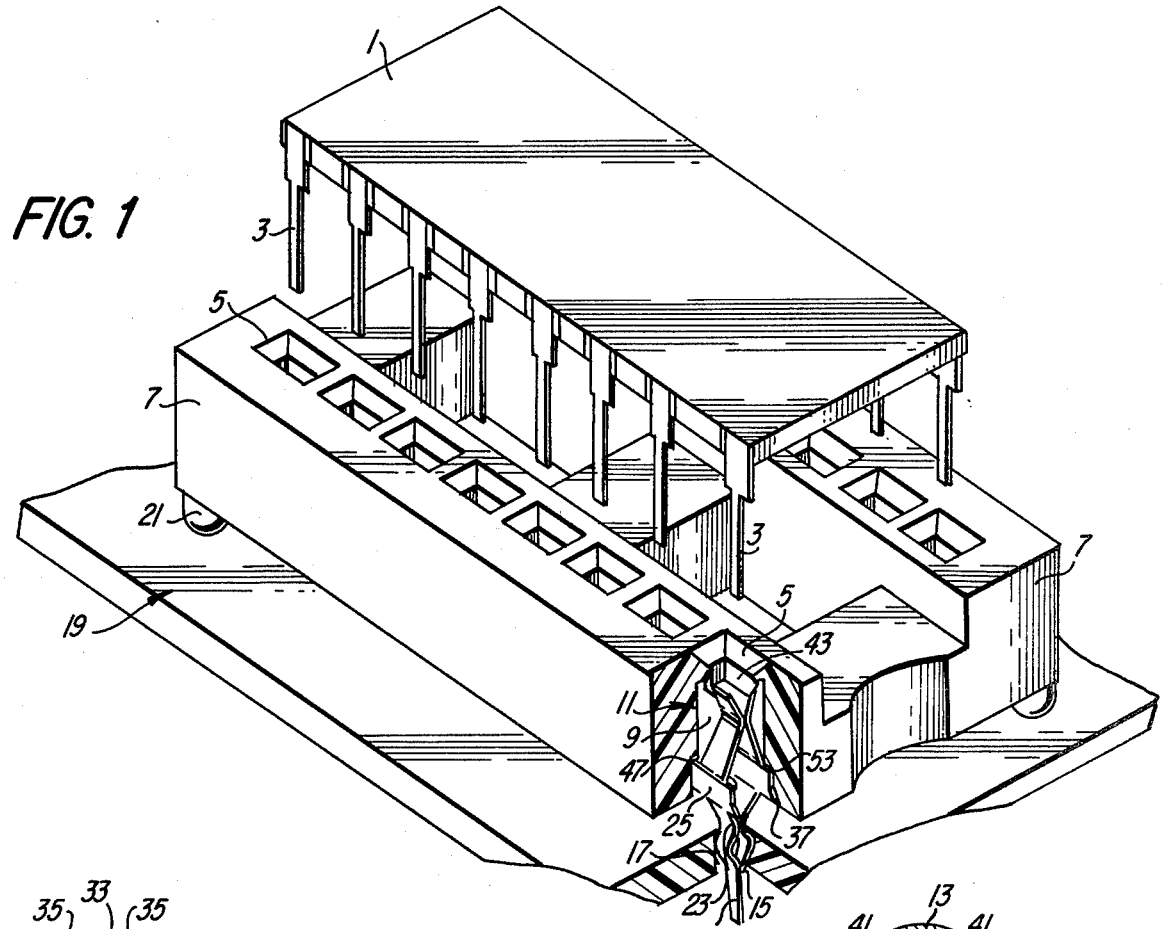

DIP SOCKET HAVING PRELOADING AND ANTIWICKING FEATURES

RELATED APPLICATIONS

This application is a continuation-in-part of application Ser. No. 849,366, filed Nov. 7, 1977, now abandoned.

BACKGROUND OF THE INVENTION

1. Field of the Invention

The invention relates to the field of electrical sockets and connectors and more particularly to a DIP socket for mounting integrated circuit devices onto printed circuit boards.

2. Description of the Prior Art

Dual-in-line-package (DIP) sockets are well-known in the prior art. Integrated circuits are commonly encapsulted in rectangular housings having a number of flat leads disposed in two parallel rows extending from opposite sides of the package, hence the name dual-in-line-package. Generally, it is not desirable to mount an integrated circuit package directly onto a printed circuit board since the heat of soldering the package leads to the board may harm or destroy some of the delicate microelectronic circuits within the package. Additionally, it is frequently useful to be able to readily remove and replace a particular integrated circuit package which may be defective without having to desolder its connections to the printed circuit board. To this end DIP sockets were developed in order to provide a relatively safe and reliable interconnection between integrated circuit packages and a printed circuit board. These sockets generally include a plastic or ceramic housing having rows of receiving holes containing socket terminals which are in alignment with the leads on the integrated circuit package which is to be connected. The DIP socket is designed to have its terminals fitted into via holes formed in a printed circuit board, soldered in place, and then to have an integrated circuit package inserted into the socket terminals of the DIP socket to make an electrical interconnection with the printed circuit board. In this manner, the DIP socket may be soldered by conventional techniques, such as wave-soldering, without in any way harming the electronic devices within the integrated circuit package. Additionally, the integrated circuit package is readily removable which aids in assembly and repairs.

However, two major problems have existed in prior art DIP socket technology. The first is in ensuring a positive, reliable and corrosion free interconnection between the leads of an integrated circuit package and the contacts of a DIP socket. Prior art devices have attempted to overcome this problem by providing cantilevered leaf spring contacts which securably grip an inserted lead. Workers in the prior art have also recognized that the tighter the seal between the inserted lead and its associated leaf spring contacts, the less likely oxidation and corrosion is to occur. However, the higher contact pressure associated with these contacts means that the force needed to insert a lead into the contacts is correspondingly higher. High insertion forces make it difficult, if not impossible to use automatic insertion machinery, since the machinery will tend to bend the contacts or leads of the components if there is any misalignment between the integrated circuit package, the DIP socket, or the printed circuit board. Ideally, the contacts themselves should also be readily insertable into the DIP socket housing and have positive locking and retention means to prevent contact loss during the various manufacturing steps associated with these socket devices. Additionally, higher insertion forces and contact pressure tend to scrape or "wipe" the metallization of both the contacts and the inserted leads. A certain amount of wipe is desirable since it helps to remove any surface oxidation or dirt on the contacts and leads. However, if it is desired to insert and remove the leads of the integrated circuit package from prior art DIP sockets more than two or three times, the high contact pressures and insertion forces of these prior art sockets often will completely strip or erode the protective metallization off of the contacts and leads, resulting in a poor, incomplete, or noisy connection and subsequent degradation of circuit performance.

Workers in the prior art have recognized that insertion forces may be substantially reduced by preloading or prestressing the contacts of the DIP socket while maintaining a high normal force or pressure against an inserted lead. Examples of such prior art preloading methods include those where small ears or spurs are formed on the ends of the contacting spring arms and are designed to fit behind mating slots in an interior cavity of the DIP socket housing. When the contact is inserted into the housing the ears on the ends of the contact arms will latch into the mating slots, slightly biasing the spring arms apart. Another method of preloading is shown in U.S. Pat. No. 3,865,462 which uses vertically disposed ramps within the socket cavity to bias apart adjacently disposed leaf spring members. A third method of preloading uses a tapered pin inserted between the contacts to bias the contacts apart so as to cause them to latch behind ledges provided within the socket housing. A fourth method of preloading is shown in British Pat. No. 1,443,288 in which the spring arms of a contact are urged apart by a pair of angled rampways, formed in an upper portion of a two piece contact receiving header, when the header portions are joined together. However, all the above prior art methods require a fairly high insertion force for inserting the contacts into the housing, require hard to machine spurs or latches and corresponding ledges to retain the contacts in their preloaded position, require a separate preloading or biasing tool to be inserted into the socket to effectuate contact preloading, or require a multipiece header with its concomitant increase in manufacturing and assembly costs. Further, prior art preloading methods tend to use portions of the contacting area itself, biased against ledges or ramps within the socket housing, to effectuate preloading. However, such techniques tend to be unreliable since the contacting area itself must make frictional contact with the ramp or ledge provided within the housing which may cause the surface of the contacting area to be damaged or eroded during a preloading operation.

Another problem with prior art preloaded contacts is that although preloading generally reduces the insertion force for a terminal to be inserted into a contact, the very same preloading techniques generally do not allow for controlling the normal forces on the inserted terminals after insertion. In most prior art techniques, after a terminal is inserted into a contact, the preloaded contact arms will lift off whatever preloading means are used into a non-contacting position with respect to the preloading means. Hence, the only force available as a normal force to an inserted terminal lead will be that provided by the spring constant of the contacting arms of the contact. Generally, this force is much lower than desirable for good contact-to-terminal electrical connectivity and does not provide adequate protection of the contacting area against oxidation and corrosion.

A second major problem encountered in prior art DIP socket technology is that of solder wicking. When a DIP socket is soldered to a printed circuit board, usually by means of wave soldering, there is a tendency for the solder and flux to "wick" up the DIP socket terminals, usually by capillary action. If flux enters the area of the leaf spring contacts within the DIP socket housing it may inhibit the proper action of the spring contacts or cause a faulty connection. If solder is wicked up into the contacting area it can "freeze" together the contacts and prevent electrical device leads from entering. Prior art DIP sockets have dealt with the solder wicking problem in a variety of ways. A common method is to use a long contact tail, to be inserted into the printed circuit board, in conjunction with high standoffs or spacers provided on the underside of the DIP socket housing to raise the DIP socket a distance away from the printed circuit board. However, this method merely slows down capillary action along the terminal, but does not prevent it altogether. Other prior art methods are shown in U.S. Pat. Nos. 3,717,841 and 3,989,331 which use DIP socket terminals having solder-resist compounds placed along a portion of their terminals to prevent capillary solder flow. Such methods suffer from the obvious defect that a special localized solder-resistant coating must be applied to a portion of each terminal. In addition, these solder resist coatings have a tendency to become brittle after a period of time and will tend to break off or flake during use, thus reducing their antiwicking properties and possibly interrupting circuit interconnections between IC leads and socket contacts. Another method, shown in U.S. Pat. No. 4,010,992, uses a friction fitting seal in the lower portion of the DIP socket body through which the contact terminal is inserted. The friction seal acts to prevent solder and flux from flowing up the terminal and into the interior of the contact cavity. However, such a method requires a more complex DIP socket housing to accommodate the plurality of friction seals needed for each DIP socket. Another technique, shown in U.S. Pat. No. 3,525,972, uses a pair of facing tail members having a bulbous section formed therebetween to prevent solder wicking. However, this bulbous section also acts as a contact retention device for sidewards insertion into a multi-piece header. Because of the sidewards insertion limitation it would be virtually impossible to preload the contact arms.

SUMMARY OF THE INVENTION

These and other problems of prior art devices are overcome in the present invention by providing a DIP socket containing a plurality of unitary metallic contacts, each contact comprising: a pair of tails at least one of which is outwardly bowed for insertion into via holes of a printed circuit coard; an antiwicking stem formed above the tails; a substantially U-shaped main body formed above the antiwicking stem having a pair of retention latches formed on the outward portions of the arms of the U-shaped main body, the main portion of the U-shaped body having a flexural surface to aid contact retention within the DIP socket housing; and a pair of facing inwardly bowed spring members formed above the U-shaped body, each spring member being arcuately curved on its upper-most edge so as to form a spring biasing surface.

The contacts are inserted into a substantially rectangular shaped unitary housing comprising a plurality of contact cavities, each cavity having a guiding taper and pin aperture formed in its upper portion for guiding the leads of an electrical device to be inserted into the DIP socket. Each cavity also has camming faces formed on the upper interior of the cavity to cooperate with the spring biasing surface formed on each spring member of a contact to controllably bias the spring members apart in a preloaded position when the contact is inserted into the cavity. The lower portion of each cavity also includes a guiding chamfer and a retention ledge for guiding the insertion of the contact and preventing overinsertion, respectively. One or more of the interior walls of each contact cavity tapers inwardly from the lower portion to the upper portion to coact with the spring members of a contact so as to increase the normal pressure on a terminal pin inserted between the spring members.

Each housing may also include raised standoffs provided on the lower side of the housing to aid in cleaning between the mounted DIP socket and the printed circuit board and to reduce the tendency of solder to flow up from the via holes of the printed circuit board into the DIP socket.

BRIEF DESCRIPTION OF THE DRAWINGS

FIG. 1 is a perspective view showing the arrangement of an integrated circuit package, a DIP socket, contacts, and printed circuit board as used in the present invention;

FIG. 2 is a front view of a contact as used in the present invention;

FIG. 2A is a front view of an alternative form for the contact shown in FIG. 2;

FIG. 3 is a side view of the contact shown in FIG. 1;

FIG. 3A is a sectional view taken along the line A—A of FIG. 3;

FIG. 3B is a sectional view taken along line B—B of FIG. 3;

FIG. 4 is a top view of the contact shown in FIG. 2;

DESCRIPTION OF THE PREFERRED EMBODIMENT

Figure 5:
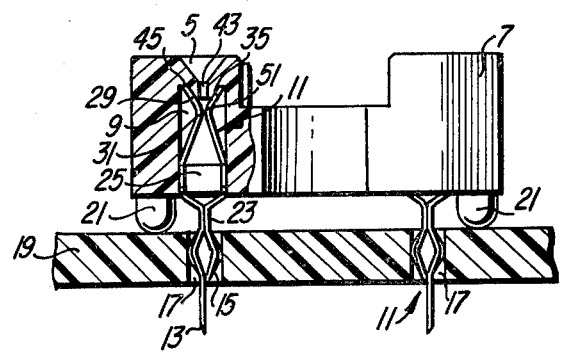
FIG. 5 is a partial sectional view of the right side of the contact housing of the present invention showing the arrangement of the contacts therein.

With reference to FIG. 1 there is shown a perspective view of the arrangement of the various components associated with the present invention. An integrated circuit package 1 having a number of metallized leads 3, would be inserted into openings 5 provided on the upward surface of DIP socket housing 7. Each opening 5 has a contact cavity 9 associated therewith. Disposed within cavities 9 are contacts 11 which are press filled into cavities 9. Each contact has a long tail 13 and a short tail 15 for insertion through via holes 17 provided in printed circuit board 19. Housing 7 is spaced away from PC board 19 by means of four standoffs 21. Each contact 11 also has an antiwicking stem 23 formed between tails 13, 15 and main body 25.

Referring to FIG. 2, there is shown a front view of the novel contact as used in the present invention. The contact is comprised of a long tail 13 and a short tail 15 which are outwardly bowed away from each other causing them to be separated by a gap 27. An antiwicking stem 23 is formed above the tail members along with a pair of spring members 29 which meet along an arcuate plane of contact 31, each spring member 29 defining a pin loading throat 33. Further, each spring member 29 has formed upon its uppermost ends an arcuate loading surface 35. Spring members 29 are joined together by a substantially box-like structure or main body 25. In an alternative embodiment, shown in FIG. 2A, contact 11 may be formed with one straight tail 16 and one outwardly bowed tail 13. This embodiment may be used when the via holes of a printed circuit board are too small for the contact shown in FIG. 2.

The front portion of the contact has formed into its surface a pair of spurs or latches 37, for more readily gripping the interior contact cavity 9 of the contact housing 7, described below. The form of latches 37 are shown more clearly in FIG. 3.

FIG. 3 shows the relative widths of the spring members 29, the box-like main body 25, and the tapered shape of the long tail 13 and the short tail 15 of the contact 11.

FIG. 4 is a top view of the contact and shows how the spine of the main body 25 is bent in a slight curve or flexural surface 39.

Figure 6:
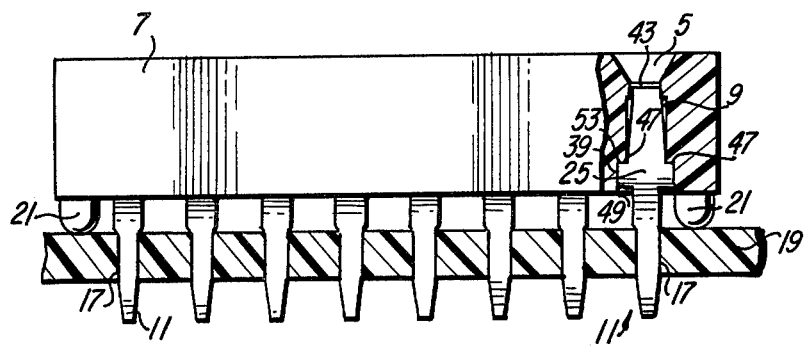
FIG. 6 is a partial sectional view of the front of the housing and contacts shown in FIG. 5.

Referring again to FIG. 2, it can be seen that long tail 13 and short tail 15 are disposed in a facing spaced apart relationship, separated by a small gap 27. The two tails 13 and 15 are intended to be inserted into one of a plurality of plated-through holes 17 (via holes) of a printed circuit (PC) card 19 such as shown in FIGS. 1, 5, and 6. Long tail 13 is extended for ease of insertion into the plated-through holes 17 in PC card 19. The two tails 13 and 15 are bowed in an arcuate shape as shown in FIG. 3A to provide locating features 41. If the embodiment shown in FIG. 2A is used, tail 16 need not be bent in an arcuate shape. Locating features 41 act to channel or guide tails 13 and 15 when the contact is inserted into the circular via holes 17 of PC card 19.

Since the curvature of tails 13 and 15 more closely conforms so that of the via holes 17, the tails are less likely to bind or gouge the via holes during insertion, even if there is a small misalignment between the tails and the via holes. This feature is especially important when using an automatic socket insertion machine to mount the socket 7 onto a PC card 19.

As shown in FIG. 2 tails 13 and 15 are bowed away from each other so as to rapidly increase the gap or bowed arch 27 between the tails and to lend some flexibility to the tails. When tails 13 and 15 are inserted through a via hole 17 of PC card 19 the bowed area 27 of tails 13 and 15 would be compressed together which allows a more positive contact with the plating of the via holes 17 of PC card 19. Additionally, since the bowed area 27 of tails 13 and 15 would be compressed together, bowed area 27 would exert an equally strong pressure upon the interior walls of the plated through holes 17 of PC card 19, thereby providing a more positive locking or retention feature to contact 11. For smaller size via holes only a single outwardly bowed tail, as shown in FIG. 2A, is necessary for good contact retention.

Further, to insure absolute retention of contacts 11 within the via holes 17 of the PC card 19, long tail 13 may be made long enough so as to allow it to be bent or crimped after insertion through a via hole. Such an aid in retention is especially useful when the contact might be used with a PC card having oversize via holes, or where a PC card contains a number of different sized via holes.

Above the bowed area 27, tails 13 and 15 come together (with a maximum separation of 2/1000 inch, or approx. 0.05 mm) along the antiwicking stem 23, also shown in a sectional view in FIG. 3B. The purpose of antiwicking stem 23 is to prevent the capillary flow of solder during a solder flow operation, as in wave soldering. It is common practice to solder contacts to the plated-through holes of a PC card by means of wave soldering wherein the assembled PC board and associated components are passed over and partially into a wave of free flowing molten solder. Unlike prior art antiwicking techniques which rely on a special coating or a bulbous portion formed along the tail members, our novel technique is to form a short antiwicking stem 23 of parallel, facing portions of the contact material above the tail members 13 and 15. As can be seen in FIG. 5, the antiwicking stem 23 resides between the contact housing 7 and the PC board 19 so as to stop the capillary flow of solder and fluxes at a point exterior to both the PC card and the contact cavity 9. This allows excess fluxes and solder to be readily removed from the exposed area between socket 7 and PC card 19 defined by the socket standoff bumps 21 (See FIG. 5).

As opposed to the prior art technique wherein a bulbous antiwicking portion of the tail members is disposed within the contact cavity area, the present invention stops solder wicking before it reaches the contact cavity area. Unlike a bulbous antiwicking portion which essentially reduces solder wicking simply by spreading the surface area of the rising solder over a larger area and hence decreasing the height to which it might flow, the present invention uses a very narrow gap (0.002 inch) to effectively seal the stem against solder wicking. Since the two portions of the tail members are placed so close together, a very large amount of force would be needed by the essentially high viscosity molten solder to travel an appreciable distance along antiwicking stem 23. Since in the present invention solder wicking is stopped before it reaches the interior of the contact cavity, in the event that the socket assembly or PC card are tipped during soldering no solder can enter the contact cavity. Prior art antiwicking techniques fall short in this regard in that they will allow some solder to flow into the contact cavities if the socket assembly is tipped during soldering, thus increasing the likelihood of contact freezing.

The main body 25 of contact 11 forms a generally U-shaped box-like support for the tails 13 and 15 and the pair of upper spring members 29. Main body 25 is designed so as to fit intimately within the plastic housing or header 7 as shown in FIGS. 5 and 6. Main body 25 is provided with a pair of spurs or latches 37 which act to physically dig into the plastic cavity 9 of header 7.

The retention feature of latches 37 is aided by flexural surface 39. The main body 25 has formed on the side opposite latches 37 a slightly arced flexural surface 39.

When a contact 11 is inserted into a cavity 9 of housing 7 the flexural surface 39 will be bent into a flatter position. This bending action will apply a force to latches 37 which will cause them to dig into the interior walls of cavity 9 of housing 7. Thus, flexural surface 39 helps to insure positive locking of the contact within housing 7.

Referring again to FIG. 2, above the main body 25, there are attached a pair of facing spring members or contacting beams 29. The point where spring members 29 join the main body 25 represents the fulcrum of the spring effect. Each spring member 29 is inwardly bowed to define a plane of contact 31 which is the actual point where electrical contact would be made with a terminal or pin of an electrical device or component such as terminals 3 of IC package 1 shown in FIG. 1. The uppermost edge of each spring member 29 has an arcuate surface or loading radius 35 formed on their inward facing surfaces. The space between the uppermost edges of spring members 20 defines a pin opening area or loading throat 33.

Figure 7:
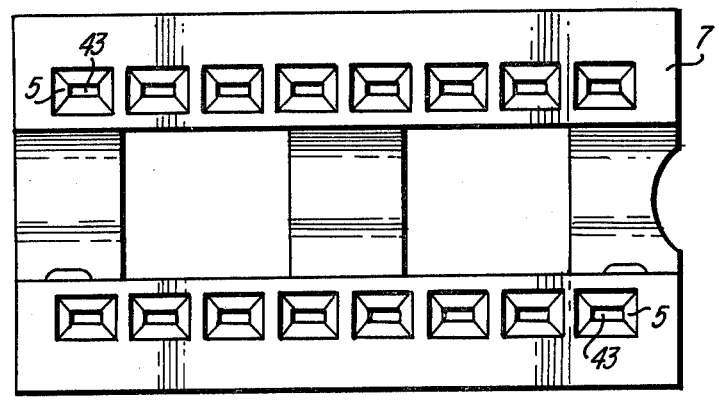
FIG. 7 is a top view of the contact housing shown in FIG. 5.
Figure 9:
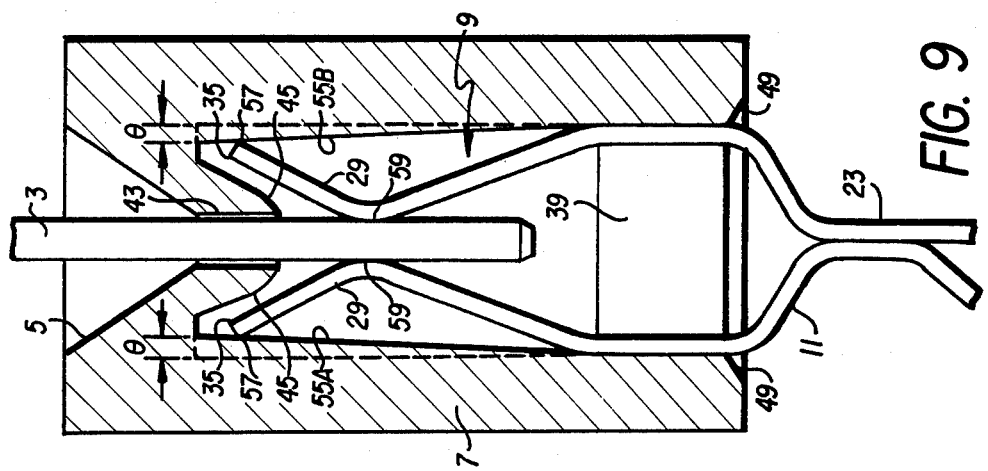
FIG. 9 is a detailed sectional view of the contact and contact receiving cavity seen in FIG. 5 showing the position of the contact after insertion of a terminal pin therein.
Figure 8:
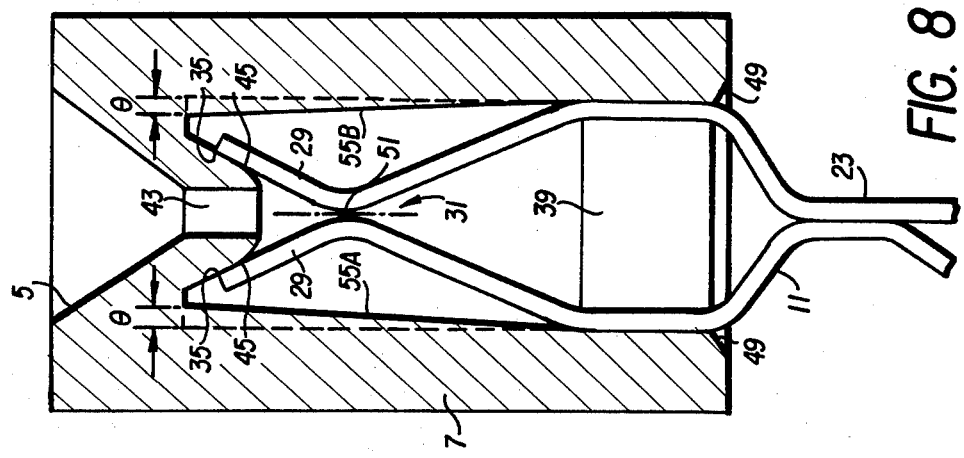
FIG. 8 is a detailed sectional view of the contact receiving cavity seen in FIG. 5 showing a contact in its preloaded position.

With reference to FIGS. 1 and 5, and the more detailed views of FIGS. 8 and 9, the above described contact is shown in its operative position within header or housing 7. Housing 7 has a plurality of substantially rectangular cavities 9 disposed within its body. In one embodiment, shown in FIGS. 1 and 7 the header 7 comprises a 16 pin dual-in-line-package (DIP) socket having two parallel rows of eight terminals each. Each cavity 9 has a substantially rectangular opening or guiding taper 5 disposed on its upward surface. At the narrow portion or opening 43 of guiding taper 5 and disposed within cavity 9 there is provided a pair of outwardly angled surfaces or camming faces 45. As shown in the front view of header 7 in FIG. 6, the side portions of cavity 9 have a pair of ledges 47 and chamfers 49 formed within its lower interior walls. Ledges 47 prevent a contact 11 from being overinserted into plastic header 7 while chamfers 49 are used to guide contact 11 into cavity 9 as is well-known in the art. Also shown in FIG. 6 are the four raised bumps or standoffs 21 which act in conjunction with antiwicking stem 23 of the contact to prevent the capillary flow of solder during a soldering operation.

Referring again to FIGS. 5, 8, and 9, camming faces 45 of housing 7 act in conjunction with the loading surfaces 35 of contact 11 to provide a precisely controlled amount of tension or "preload" to spring members 29. During the assembly of the DIP socket a contact 11 would be inserted through the lower rectangular opening of cavity 9. As the contact 11 is pressed into place, the loading surfaces 35 of spring members 29 will contact the oppositely disposed camming faces 45. Upon further insertion pressure spring members 29 will be forced apart along their plane of contact 31 into a preloaded position as shown in FIG. 8. This camming action causes the pin loading throat 33 to be opened into a narrow gap 51 between spring members 29. Additionally, while spring members 29 are being forced apart, insertion causes latches 37 to dig into chamfers 49, with the aid of flexural surface 39 mentioned above, to securably retain contact 11 within cavity 9 as shown in FIG. 6.

Preloading is a well-known method of storing energy in electrical spring contacts and of lowering the insertion force required for a terminal. However, the present invention differs from prior art techniques in two respects: first in that it uses a simpler and more controllable method of preloading and hence lowers the terminal insertion force required; and, second in that the interior walls of the contact receiving cavities are tapered inwardly from the lower portion to the upper portion of the cavity to coact with the upper edges of the contact spring members so as to increase the normal (perpendicular) pressure on a terminal pin inserted between the spring members.

As shown in FIG. 8, in the present invention the initial preloading occurs automatically when contact 11 is inserted into cavity 9 of header 7 since the two loading surfaces 35 of facing spring members 29 will be biased against the two camming faces 45. The gap 51 caused by preloading can be readily controlled by controlling the depth to which the contact 11 may be inserted into cavity 9. Depth of insertion is controlled in the present invention by the provision of ledges 47 which act in conjunction with the upper shoulders 35 of main body 25 to prevent over insertion of contact 11 into cavity 9.

As discussed above, preloading lowers the initial force necessary to move the spring members 29 of contact 11 apart when inserting a terminal path or lead 3 therebetween. However, this initially low insertion force leads to a low normal force against the terminal by the spring members once the terminal is fully inserted. This is an undesirable condition, since a relatively low normal force by the spring member does not ensure good electrical connectivity between the spring members 29 and the terminal 3. Further, the higher the normal force the better the seal between spring members 29 and terminal 3, thus reducing oxidation and corrosion problems which also effect electrical connectivity. In addition, a high normal force ensures that the terminal will be securely gripped thus reducing the possibility of the entire terminal or IC package 1 from falling out of socket 7. This feature is especially important when the socket assembly is to be used in a high vibration environment or where the socket will be mounted upside-down.

The DIP socket of the present invention is designed to be used with integrated circuit packages (ICs) or other electrical devices having a plurality of leads projecting therefrom (so-called "flat-packs"). Normally, such leads are rectangular in shape and are composed of tin-plated KOVAR material, usually 15-20 thousandths of an inch wide (0.4-0.5 mm) by 9-12 thousandths of an inch thick (0.2-0.3 mm) which is an industry standard. The leads may be either tapered or untapered. In operation, each pin or lead from an IC package would be guided into its electrically engaged position by rectangular guiding taper 5 and steered into the contact cavity 9 by rectangular pin aperture 43. As the pin is inserted through pin aperture 43 it will be thereby guided into the gap 51 produced by the aforementioned preloading. Of course, the size and shape of the guiding taper 5 and the pin aperture 43 may be varied depending upon the size and shape of the lead to be inserted. As shown in FIG. 8, the gap 51 resulting from preloading is designed to be less than the minimum thickness of the pin or lead of the IC package or electrical device which is to be inserted. When the pin 3 is pressed into gap 51, as shown in FIG. 9, spring members 29 will be forced apart and the previously stored energy from preloading will be available as a normal force to obtain intimate contact between the spring members 29 and the inserted lead or pin along the contact area 59.

It is well-known that the higher the pressure between contacting surfaces (e.g. spring members 29 and an inserted pin or lead) the more reliable the electrical connection between these members. However, if such force is made too high, it than becomes almost impossible to insert any lead between the spring members 29. By preloading spring members 29 a relatively low insertion force is made possible. In addition, placing the plane of contact 31 at a considerable distance from the fulcrum of spring members 29 (i.e. where they join main body 25) means that when a lead or pin is inserted a smaller insertion force is needed to separate spring members 20 since the greater the fulcrum-to-contact plane distance the lesser the insertion force required. Additionally, it should be noted that by keeping the plane of contact 31 small, as shown in FIGS. 2, 5 and 8, the normal forces exerted by spring members 29 against an inserted lead or pin will generate a large pressure (pressure being a product of both area and force) against the lead or pin along the plane of contact 31. The resultant high pressure aids in making a gas-tight inter-connection between an inserted lead and spring members 29 which will be comparatively free of oxidization and corrosion.

In order to overcome the aforementioned problems with preloaded sockets, we have formed the interior walls of cavities 9 of the contact housing 7 with an inward taper shown clearly in FIGS. 8 and 9. One or more of the walls 55A, 55B facing spring members 29 is formed having a slight inward taper from the vertical indicated as angle $\theta$ (typically about 4 degrees). The taper of the cavity walls narrows from the lower portion of the cavity to the upper portion of the cavity near the preloading means 45. The dashed lines of FIG. 9 indicate the position a true vertical wall would have if formed in cavity 9.

As is apparent from FIG. 9 spring members 29 of contact 11 will contact the tapered walls 55A, 55B at points 57 during the insertion of a terminal 3. The geometry of the spring members 29 and tapered walls 55A, 55B is such that spring members 29 will contact tapered walls 55A, 55B at points 57 before terminal 3 is fully inserted between the spring members along the plane of contact 31. This coaction and cooperation of the spring members 29 with the tapered interior walls 55A, 55B will result in a higher normal force along contacting area 59 than would be available if spring members 29 were allowed to spread apart unrestrained as is common in prior art preloading techniques. Thus, the present invention allows a low initial insertion force through preloading of the contact spring member, while providing for a subsequent high normal force against a terminal after insertion. It will be noted that the above concepts work equally well for the case in which only one interior wall (for example 55A) is tapered inwardly as shown in FIGS. 8 and 9, with only minor adjustment made to the taper angle $\theta$.

With reference to FIGS. 5 and 6, the plastic bumps or standoffs 21 are shown in more detail. Prior art devices have used standoffs to prevent intimate contact between the underside of the plastic housings or headers for DIP sockets and the printed circuit card upon which they are mounted. Standoffs allow dirt, contaminants, and unwanted fluxes left over after a soldering operation to be more readily removed. However, prior art standoffs have generally been much shorter than those provided in the present invention. The present invention uses high standoffs for two reasons: first, to make it even easier to thoroughly clean between PC board 19 and the plastic housing 7; and second, the high standoffs 21 aid in the operation of the antiwicking stem 23 of the contacts 11. Solder cannot flow very high so that the increased height of the housing 7 above PC card 19 coupled with the intimate contact of tails 13 and 15 along antiwicking stem 23 of contacts 11 help to prevent wicking.

An advantageous aspect of the present invention is that contacts 11 may be formed in a single metal stamping operation. The above-described contacts are preferably formed from a sheet of beryllium-copper, or CA638 manufactured by Olin Brass Co. The sheet material is preplated, preferably of tin or gold to aid in corrosion resistance and solderability, prior to die stamping of the contact. The plated sheet material is passed through a stamping die to remove unwanted material. Subsequently main body 25 is formed into a U-shaped box-like structure as shown in FIG. 4. Spring members 29 and the bows in tails 13 and 15 are all formed in the same die stamping operation. Ordinarily, a plurality of contacts will be formed along a long thin "tape" of the sheet material, with each contact having a scored break-off line along one of its tails to enable an operator to remove a finished contact from the tape of sheet material. The finished unitary contact may then be inserted into the header by automatic machinery or by hand. The plastic header 7 is molded from Valox 420, a non-burning, high dimensionally stable thermoplastic material. Of course, many other contact and header materials would suggest themselves to those skilled in the art.

In the preferred embodiment, using tin-plated beryllium-copper contacts and a header formed of Valox 420, IC leads have been inserted over 40 times into the DIP socket of the present invention with no damage to the contact plating. Normally, when an IC lead is inserted into prior art DIP sockets the contact plating will be damaged within five to ten insertions and removals, and often on the first insertion. This great improvement over prior art devices in the number of insertions and removals without degradation of the contacts results from the very low insertion force needed to insert a component lead or an IC package into the DIP socket contacts of the present invention. It will be noted that while insertion force is low, the normal forces due to preloading and the coaction of the spring members 29 against the tapered interior cavity walls 55A, 55B against an inserted pin or lead will be quite high, insuring a gas-tight seal and excellent electrical connectivity between the contact and the inserted lead.

Additionally, the locating features 41 of tails 13 and 15 shown in FIG. 3A, by locating the tails very accurately within the holes of a PC board, allow automatic insertion apparatus (such as a tape-controlled socket insertion machine) to be used to insert the DIP sockets into a PC board, subject of course to the accuracy with which the PC board is made. Further, the low terminal insertion force required allows the same automatic apparatus to be used to insert IC packages or electrical components into the mounted DIP socket of the present invention after the DIP socket is soldered to a PC board.

While the DIP socket assembly of the present invention has been described in considerable detail, it is understood that various changes and modifications may occur to persons of ordinary skill in the art without departing from the spirit and scope of the invention as is defined in the appended claims.

What is claimed is:

1. An electrical connector assembly comprising:
   (a) a plurality of unitary metallic contacts, each of said contacts comprising:
      (i) a pair of tail members at least one of which is outwardly bowed;
      (ii) an antiwicking stem formed above said tail members, said antiwicking stem comprising parallel facing portions of said tail members;
      (iii) a substantially U-shaped main body formed above said antiwicking stem; and
      (iv) a pair of inwardly bowed spring members formed above said U-shaped body; and
   (b) a unitary contact housing having a plurality of contact cavities, each of said cavities comprising:
      (i) guiding means formed in an upper portion of said cavity for guiding leads of an electrical device to be inserted into said cavity;
      (ii) camming means formed on said upper portion of said cavity to controllably bias said spring members apart in a preloaded position when said contact is inserted into said cavity; and
      (iii) one or more interior walls of each of said contact cavities tapering inwardly from a lower portion to said upper portion of said cavity to coact with said spring members so as to increase the normal pressure on a terminal pin inserted between said spring members.

2. The electrical connector assembly of claim 1 wherein said parallel facing portions of said tail members are in substantial contacting engagement with each other.

3. The electrical connector assembly of claim 1 wherein one of said tail members is longer than the other.

4. The electrical connector assembly of claim 1 wherein at least one of said tail members is formed having a concave cross-section, said concavity facing the other tail member.

5. The electrical connector assembly of claim 1 wherein said U-shaped body comprises a curved spine and a pair of contact retention arms.

6. The electrical connector assembly of claim 1 wherein said bowed spring members are bowed in a substantially hourglass-type configuration.

7. The electrical connector assembly of claim 1 wherein said guiding means comprises a pin aperture formed in said upper portion of said contact cavity and a guiding taper formed above said pin aperture for guiding lead of an electrical device to be inserted into said contact cavity.

8. The electrical connector assembly of claim 1 wherein said camming means comprises a pair of oppositely disposed angled rampways formed adjacent to said guiding means.

9. An electrical connector assembly comprising:
   (a) a plurality of unitary metallic contacts for insertion into a socket housing, each of said contacts comprising:
      (i) a pair of tail members at least one of which is outwardly bowed for insertion into via holes of a printed circuit board;
      (ii) an antiwicking stem formed above said tail members, said antiwicking stem comprising parallel facing portions of said tail members;
      (iii) a substantially U-shaped main body formed above said antiwicking stem, said U-shaped body having a curved spine and a pair of contact retention arms; and
      (iv) a pair of facing inwardly bowed spring members formed above said U-shaped body, each spring member being arcuately curved on its uppermost edge so as to form a spring biasing surface; and
   (b) a substantially rectangular shaped unitary housing having a plurality of contact cavities, each of said cavities comprising:
      (i) a pin aperture formed in an upper interior portion of said cavity and a guiding taper formed above said pin aperture for guiding leads of an electrical device to be inserted into said contact cavity;
      (ii) camming faces formed on said upper interior portion of said cavity to cooperate with said spring biasing surfaces of said spring members to controllably bias said spring members apart in a preloaded position when said contact is inserted into said cavity; and
      (iii) one or more interior walls of each of said contact cavities tapering inwardly from a lower portion to said upper portion of said cavity to coact with said spring members so as to increase the normal pressure on a terminal pin inserted between said spring members.

10. The electrical connector assembly of claim 9 wherein said curved spine of said U-shaped body comprises a flexural surface to aid contact retention within said socket housing.

11. The electrical connector assembly of claim 9 wherein said camming faces comprise a pair of oppositely disposed angled rampways formed circumferentially to said pin aperture.

12. The electrical connector assembly of claim 9 wherein each of said contact cavities further includes a guiding chamfer formed in a lower interior portion of said cavity for guiding said contact during insertion into said cavity.

13. The electrical connector assembly of claim 9 wherein each of said contact cavities further includes a retention ledge formed in a lower interior portion of said cavity for preventing over-insertion of said contact into said cavity.

14. The electrical connector assembly of claim 9 wherein said housing further includes a plurality of spacer means provided on a lower portion of said housing for spacing said housing above said printed circuit board when said housing is mounted on said printed circuit board.

15. The electrical connector assembly of claim 9 wherein said contact retention arms further include latching means disposed on outer portions of said arms for contacting engagement with interior walls of said contact cavity.

16. The electrical connector assembly of claim 15, wherein said latching means comprises outwardly projecting spurs formed integral with said arms for securably engagement with said interior walls of said contact cavity when said contact is inserted inot said cavity.

17. An electrical connector assembly comprising:
   (a) a plurality of unitary metallic contacts for insertion into a socket housing having a plurality of contact receiving cavities, each of said contacts comprising:
      (i) a pair of tails at least one of which is outwardly bowed for insertion into via holes of a printed circuit board;

(ii) an antiwicking stem formed above said tails, said antiwicking stem comprising parallel facing portions of said tails;

(iii) a substantially U-shaped main body formed above said antiwicking stem, said U-shaped body comprising a spine and a pair of arms, said spine of said U-shaped main body having a flexural surface and said pair of arms each having a retention latch formed on its outward portions, said flexural surface and said retention latches cooperating to securably retain said contacts within said contact receiving cavities; and (iv) a pair of contacting, oppositely disposed, inwardly bowed spring beam contacts formed above said U-shaped body, each spring beam contact being arcuately curved on its uppermost edge so as to form a spring biasing surface;

(b) a substantially rectangular shaped unitary housing having a plurality of contact cavities, each of said cavities comprising:

(i) a pin aperture formed in an upper interior portion of said cavity and a guiding taper formed above said pin aperture for guiding leads of an electrical device to be inserted into said socket cavity;

(ii) a pair of camming faces disposed circumferentially with respect to said pin aperture in said upper interior portion of said cavity to cooperate with said spring biasing surfaces of said spring beam contacts to controllably bias said spring beam contacts apart in a preloaded position when said contact is inserted into said cavity;

(iii) one or more interior walls of each of said contact cavities tapering inwardly from a lower interior portion to said upper interior portion of said cavity to coact with said spring beam contacts so as to increase the normal pressure on a terminal pin inserted between said spring beam contacts;

(iv) a guiding chamfer formed in a lower interior portion of said cavity for guiding said contact during insertion into said cavity; and (v) a retention ledge formed in said lower interior portion of said cavity for preventing over-insertion of said contact into said cavity; and (c) a plurality of raised standoffs formed on a lower portion of said housing.

* * * * *